(12) United States Patent
Ryou

(10) Patent No.: US 7,749,878 B2
(45) Date of Patent: Jul. 6, 2010

(54) METHOD FOR MANUFACTURING A SEMICONDUCTOR DEVICE

(75) Inventor: Eui Kyu Ryou, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 579 days.

(21) Appl. No.: 11/614,573

(22) Filed: Dec. 21, 2006

(65) Prior Publication Data

US 2007/0161166 A1    Jul. 12, 2007

(30) Foreign Application Priority Data

Dec. 27, 2005    (KR) .................. 10-2005-0130862

(51) Int. Cl.
*H01L 21/20* (2006.01)

(52) U.S. Cl. ............... 438/584; 438/671; 438/717; 438/725; 438/669; 438/636; 257/327; 257/330; 257/E21.428; 257/E29.13

(58) Field of Classification Search ............. 438/584, 438/585, 574, 671, 717, 725, 669, 636; 257/327, 257/330, E21.428, E29.13
See application file for complete search history.

(56) References Cited

U.S. PATENT DOCUMENTS

| | | | |
|---|---|---|---|
| 5,824,578 A * | 10/1998 | Yang | 438/231 |
| 6,033,963 A * | 3/2000 | Huang et al. | 438/303 |
| 6,197,687 B1 * | 3/2001 | Buynoski | 438/671 |
| 6,248,653 B1 * | 6/2001 | Shirahata et al. | 438/585 |
| 6,337,262 B1 * | 1/2002 | Pradeep et al. | 438/574 |
| 2005/0106493 A1 * | 5/2005 | Ho et al. | 430/270.1 |

FOREIGN PATENT DOCUMENTS

JP    07-094715    4/1995

* cited by examiner

*Primary Examiner*—Matthew Smith
*Assistant Examiner*—Wilner Jean Baptiste
(74) *Attorney, Agent, or Firm*—Sherr & Vaughn, PLLC

(57) ABSTRACT

Embodiments relate to a method for manufacturing a semiconductor device that may be capable of obtaining a stable device characteristic by securing an optimal CD of a gate. In embodiments, a method may include forming a gate oxide layer on a semiconductor substrate, forming a photoresist pattern at a first region of an upper portion of the gate oxide layer, forming an insulating layer on the substrate of a second region except for the photoresist pattern, removing the photoresist pattern after a formation of the insulating layer, forming a polysilicon on the substrate from which the photoresist pattern is removed, planarizing the polysilicon to expose the insulating layer in order to form a gate, forming sidewalls at both sides of the gate: and implanting ions in a resulting object using the sidewalls as a mask to form source/drain.

16 Claims, 5 Drawing Sheets

METHOD FOR MANUFACTURING A SEMICONDUCTOR DEVICE

The present application claims priority under 35 U.S.C. 119 and 35 U.S.C. 365 to Korean Patent Application No. 10-2005-0130862 (filed on Dec. 27, 2005), which is hereby incorporated by reference in its entirety.

BACKGROUND

A semiconductor device may have a construction such as a bipolar IC or Metal Oxide Silicon (MOS) IC. Such a semiconductor device may be used as a switch or memory in various devices.

FIG. 1 is an example diagram illustrating a related art semiconductor device.

Referring to FIG. 1, substrate 1 may be a p-type silicon substrate. To define an active region of substrate 1, field layers 2 and 3 may be formed at a field area of substrate 1.

Gate oxide layer 6 may be grown on substrate 1, for example by a thermal oxidization. Polysilicon 7 may be deposited on gate oxide layer 6, for example by chemical vapor deposition (CVD). Next, polysilicon 7 and gate oxide layer 6 may be patterned by a photolithograph process to form gate 7.

An insulating layer may be thickly formed and etched on substrate 1 on which gate 7 may be formed, and may form sidewall 8 at a sidewall of the gate. N-type impurity ions (e.g. arsenic As) may be implanted in the resulting object, for example using sidewall 8 as a mask to form source/drain 4 and 5.

In a semiconductor device, a variation of a critical dimension CD in a gate may significantly change a drive current of a semiconductor device. Accordingly, an optimization of the CD in the gate may be important.

For example, as a CD of a gate is increased, a driver current may be reduced. Thus a CD of a gate may be inversely proportional to a drive current. Because an amplitude of the drive current may control an operation speed of the semiconductor device, a variation of a CD in the gate may affect an overall operation of the semiconductor device. Precise management of a CD in a gate may determine a quality of a semiconductor device.

Furthermore, a variation of a CD in a gate may cause an increase in a leakage current and a reduction in saturation current.

Referring to FIG. 2, gate oxide layer 6 and polysilicon 7 may have been formed on substrate 1. The resulting object may then be coated with a photoresist material. Next, the photoresist material may be exposed to light using mask pattern 13 to form photoresist pattern 11. A resulting object may be etched using photoresist pattern 11 as a mask to form gate 7.

Where gate 7 by the aforementioned process may be formed, photoresist pattern 11 may be formed to exactly have a size of 'a' by mask pattern 13. Nevertheless, when an etching process is performed using photoresist pattern 11 having an exact size of 'a' as a mask, a size of a gate may be changed to a±2 b which is not 'a' due to an etching bias.

Hence, in the related art, as a size of the gate may be increased or reduced in comparison with a desired size, a CD of the gate may be changed. As a result, as the drive current varies, an operation speed of the semiconductor device they become non-uniform, and may result in instability of a device characteristic.

SUMMARY

Embodiments relate to a method for manufacturing a semiconductor device.

Embodiments relate to a method for manufacturing a semiconductor device that may be capable of obtaining a stable device characteristic by securing an optimal CD of a gate.

In embodiments, a method for manufacturing a semiconductor device may include forming a gate oxide layer on a semiconductor substrate, forming a photoresist pattern at a first region of an upper portion of the gate oxide layer, forming an insulating layer on the substrate of a second region except for the photoresist pattern, removing the photoresist pattern after a formation of the insulating layer, forming a polysilicon on the substrate from which the photoresist pattern may be removed, planarizing the polysilicon to expose the insulating layer in order to form a gate, forming sidewalls at both sides of the gate: and implanting ions in a resulting object using the sidewalls as a mask to form source/drain.

DETAILED DESCRIPTION OF EMBODIMENTS

Figure 1:
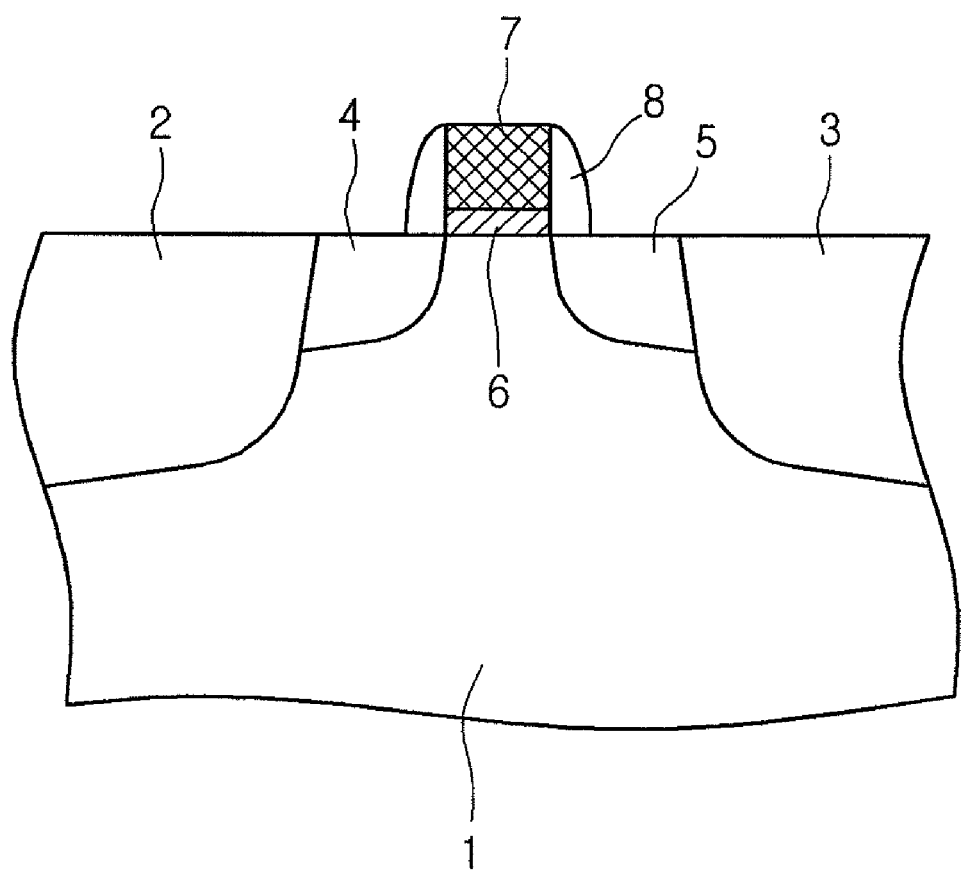
FIG. 1 is an example diagram illustrating a related art semiconductor device.
Figure 2:
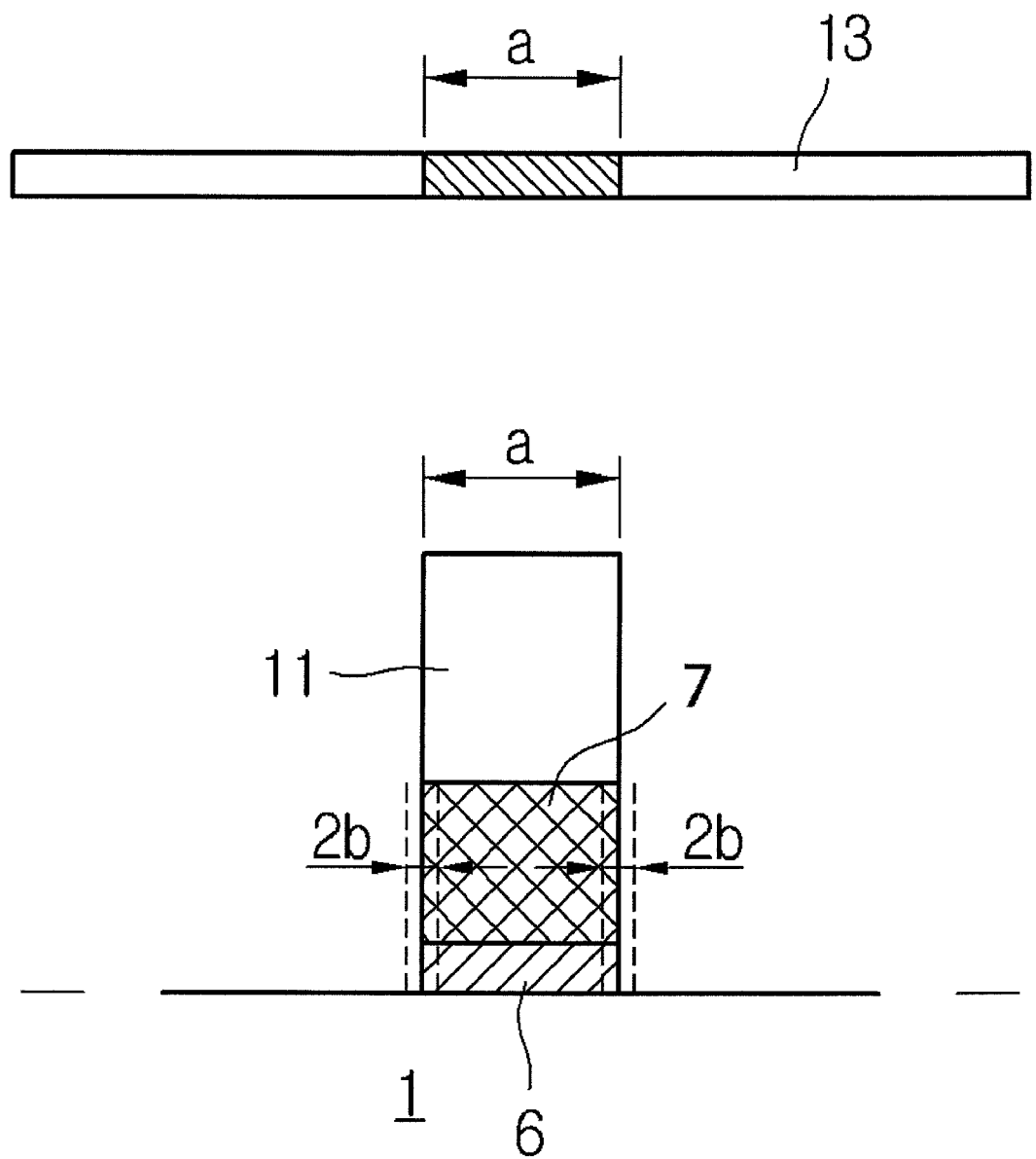
FIG. 2 is an example diagram illustrating a changed shape of a CD by an etch bias in a gate formation of FIG. 1.
Figure 3:
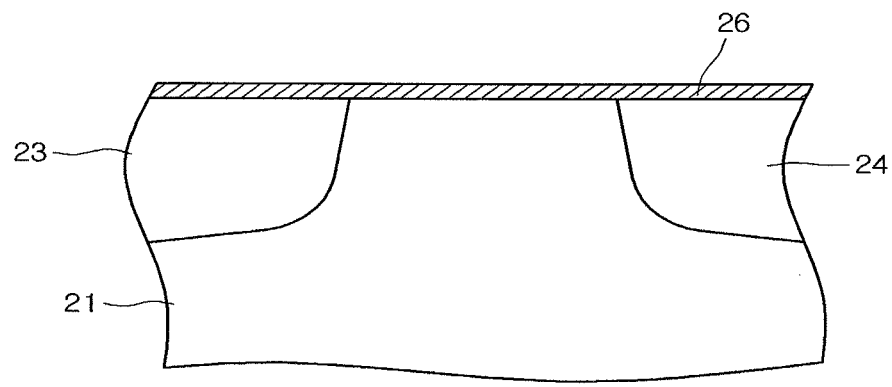
FIGS. 3 to 8 are example cross-sectional diagrams illustrating a semiconductor device and a method for manufacturing a semiconductor device according to embodiments.

Referring to FIG. 3, an active region on substrate 21, for example, p-type silicon substrate, may be defined by field layers 23 and 24, which may be formed at field regions of substrate 21. Field layers 23 and 24 may be formed by a shallow trench isolation (STI) process or a local oxidation of silicon (LOCOS) process.

The field regions may be formed at both sides of the active region. The active region may be a formation region of a transistor, and the field regions may insulate between adjacent active regions.

Gate oxide layer 26 may be grown by thermally oxidizing substrate 21, including field layers 23 and 24. Because gate oxide layer 26 determines a channel of a lower portion, it may be formed to have an optimized thickness.

Figure 4:
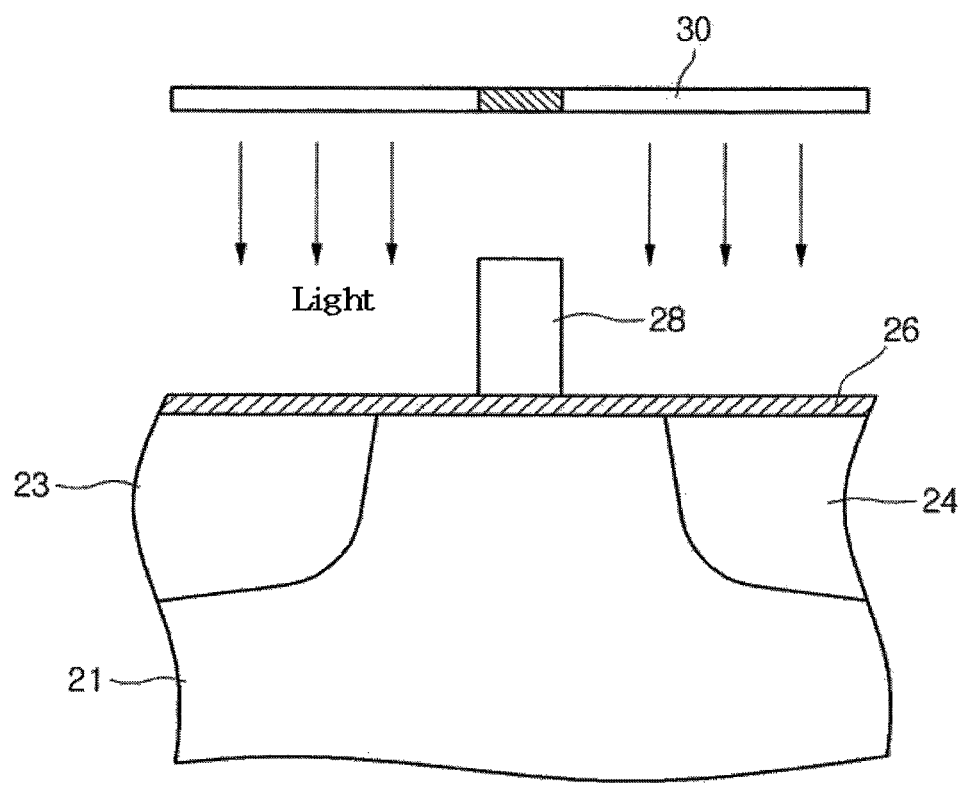

Referring to FIG. 4, a photoresist material may be coated on substrate 21, on which gate oxide layer 26 may have been grown. The resulting object may be exposed to light using previously prepared mask pattern 30 to form corresponding photoresist pattern 28 at a formation of the gate.

Figure 5:
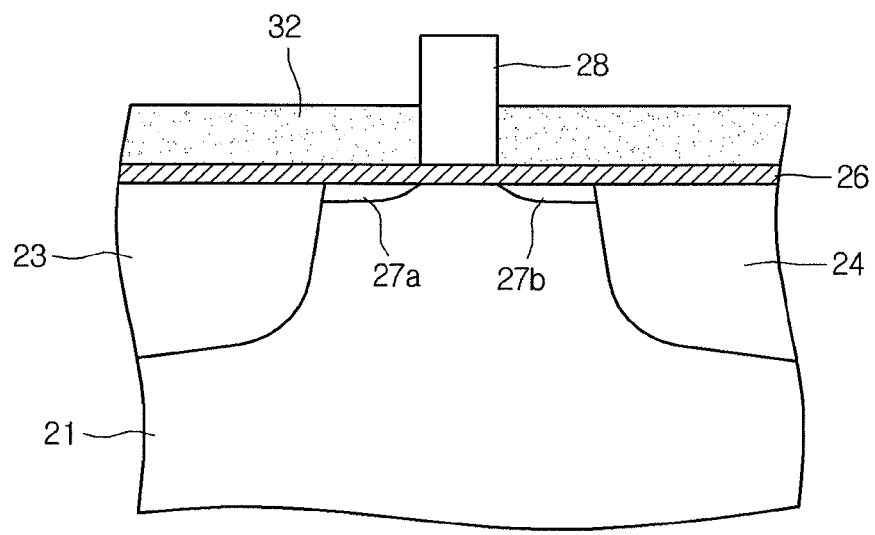

Referring to FIG. 5, a low concentration of n-type impurity ions (for example, arsenic As) may be implanted in substrate 21 on which photoresist pattern 28 may be formed, and may form lightly doped drain (LDD) regions 27a and 27b. According to embodiments, photoresist pattern 28 may function as a mask. Accordingly, impurity ions (e.g. arsenic As) may not implanted in a lower portion of photoresist pattern 28 but may be implanted in lower substrate 21 around photoresist pattern 28. According to embodiments, LDD regions 27a and 27b may be thinly formed in substrate 21 between photoresist pattern 28 and field layers 23 and 24.

LDD regions 27a and 27b may buffer a high drain voltage and may prevent a rapid potential variation. This may suppress an occurrence of a hot carrier.

Insulating layer 32 may be formed on gate oxide layer 26, except for a region where photoresist pattern 28 exists. Insulating layer 32 may be an oxide layer or a nitride layer, according to embodiments. In embodiments, an oxide layer may form insulating layer 32. However, embodiments are not limited thereto.

Hence, according to embodiments, liquid oxide layer 32 functioning as insulating layer 32 may be grown to a prescribed thickness, for example by using gate oxide layer 26 as a seed.

According to embodiments, gate oxide layer 26, which may be present at a lower portion of photoresist pattern 28, may not be exposed to light. Accordingly liquid oxide layer 32 may be formed on gate oxide layer 26, except where photoresist pattern 28 exists.

Liquid oxide layer 32 may be formed by spraying a water solution with $H_3BO_3$ in $H_2SiF$ water solution. Further, liquid oxide layer 32 may be formed by dipping the water solution with $H_3BO_3$ in the $H_2SiF$ water solution.

Moreover, a curing process of liquid oxide layer 32 may be carried out. Liquid oxide layer 32 may have a same thickness as that of a polysilicon for forming a gate to be formed later.

Embodiments are not limited to liquid oxide layer 32. That is, an oxide layer and an insulating layer ground in gate oxide layer 26, may be used. Hence, according to embodiments another oxide layer or nitride layer in addition to gate oxide layer 26 may be grown.

Figure 6:
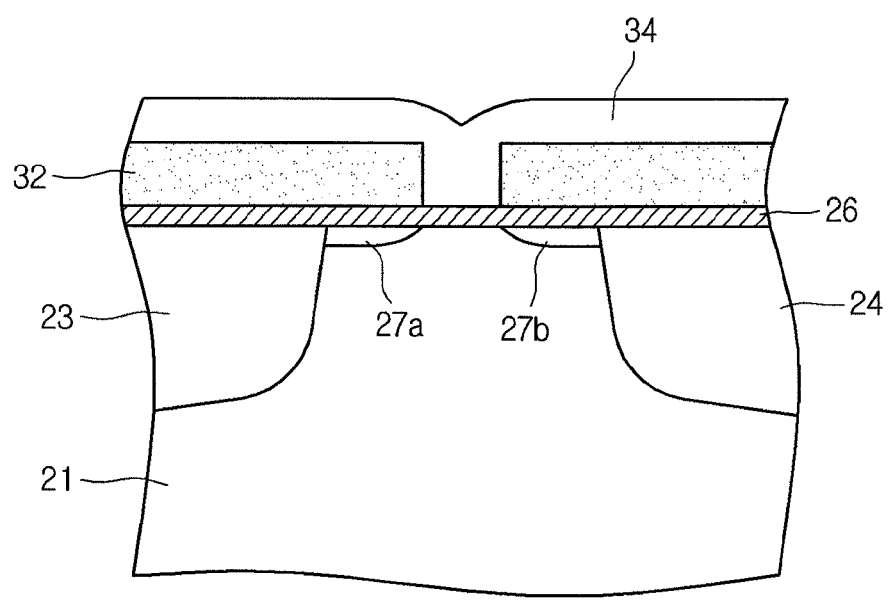

Referring to FIG. 6, liquid oxide layer 32 may be formed. Photoresist pattern 28 may than be removed, for example by a strip process. Polysilicon 34 may then be formed to have a prescribed thickness. According to embodiments, polysilicon 34 may be formed to completely cover a region from which at least photoresist pattern 28 may be removed.

Figure 7:
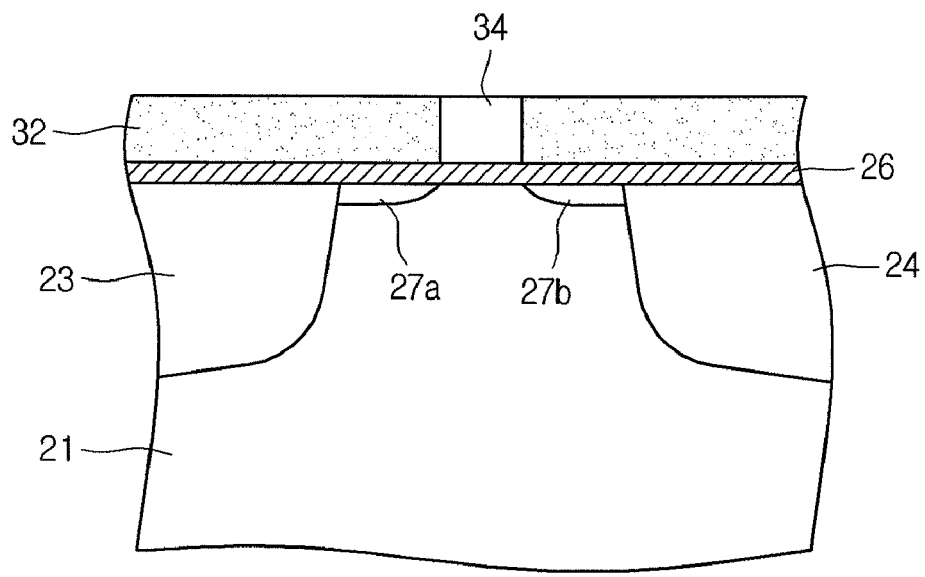

Referring to FIG. 7, a resulting object may be polished, for example by a chemical mechanical polishing process, until liquid oxide layer 32 may be exposed. Accordingly polysilicon 32 may be formed over only a partial region (for example, a formation region of a gate). Hence, the polysilicon may be formed at a formation region of the gate.

Figure 8:
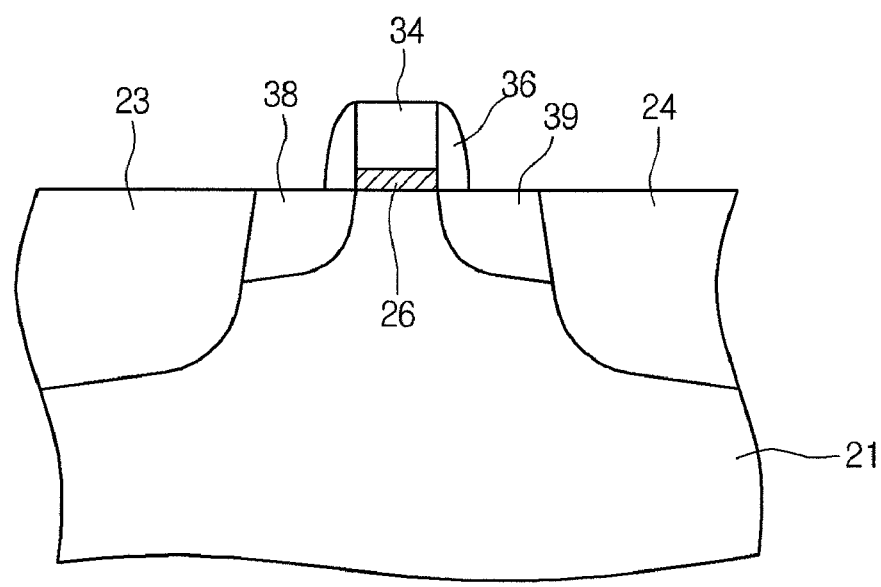

Referring to FIG. 8, liquid oxide layer 32 and gate oxide layer 26 may be etched to form a gate composed of polysilicon 34 and gate oxide layer 26, which may be positioned at a lower portion of polysilicon 34.

According to embodiments, liquid oxide layer 32 may be grown in a remaining region other than photoresist pattern 28. Further, after photoresist pattern 28 has been removed, polysilicon 34 may be formed at a region from which the photoresist pattern may be removed and may finally form the gate. Accordingly, because the gate may be formed to have a prescribed size according to design, a uniform drive current may be secured. Stable device operational characteristics they thereby be achieved.

According to embodiments, since polysilicon 34 may be formed using liquid oxide layer 32 grown from gate oxide layer 26 without using an etching process affecting a size of the gate, it may not affected at all by an etch bias. A result may be that a stable device characteristic may be obtained.

According to embodiments, the step of forming sidewalls 36 at both sides of the gate may form sidewalls 36 at both sides of the gate by selectively etching exposed liquid oxide layer 32.

Further, according to embodiments, to form sidewalls 36 at both sides of the gate, exposed liquid oxide layer 32 may be prudent. Second insulating layer 36 may be formed on a semiconductor substrate from which liquid oxide layer 32 may have been removed. Second insulating layer 36 may be selectively etched, thereby forming sidewalls 36 at both sides of the gate.

A high concentration of an n-type impurity ions (for example, arsenic As) may be implanted in the resulting object using the gate and sidewalls 36 to form source/drain 38 and 39.

According to embodiments, to prevent etching bias, the polysilicon may not formed by an etching process, but may instead be formed using a liquid oxide layer grown from the gate oxide layer. Accordingly, a size of the gate may be constant, which may allow a stable operational device characteristic to be obtained.

The above described embodiments may relate to an NMOS semiconductor device having a p-type substrate. In embodiments, the same results may be obtained on a PMOS semiconductor device having an n-type substrate.

According to embodiments, since a polysilicon may be formed using a liquid oxide layer grown from a gate oxide layer, a gate of a constant size may be obtained and may result in stable device operational characteristics.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method comprising:
   forming a gate oxide layer on a semiconductor substrate;
   forming a photoresist pattern directly on a first region of the gate oxide layer;
   forming an insulating layer over a second region of the gate oxide layer;
   removing the photoresist pattern after forming the insulating layer; and
   forming a polysilicon layer over the first region of the gate oxide layer after the photoresist pattern has been removed to form a gate,
   wherein said forming a polysilicon layer comprises filling an opening remaining after removing the photoresist pattern with polysilicon such that a width of the polysilicon is identical to a width of the photoresist pattern.

2. The method of claim 1, wherein the second region comprises a portion of the substrate excluding only the first region containing the photoresist pattern.

3. The method of claim 1, wherein the insulating layer is formed to have a first height equivalent to a height of the gate.

4. The method of claim 1, wherein the insulating layer comprises a liquid oxide layer.

5. The method of claim 4, wherein the liquid oxide layer grows using the gate oxide layer as a seed.

6. The method of claim 1, wherein the first region comprises a formation region of the gate.

7. The method of claim 1, wherein a thickness of the insulating layer is greater than a thickness of the polysilicon.

8. The method of claim 1, further comprising:
   planarizing the polysilicon to expose the insulating layer to form the gate;
   forming sidewalls at both sides of the gate; and
   implanting ions in a resulting object using the sidewalls as a mask to form a source/drain.

9. The method of claim 8, wherein the planarization is performed by a chemical mechanical polishing.

10. The method of claim 8, wherein polysilicon remains at only the first region by the planarization step.

11. The method of claim 8, further comprising implanting ions using the photoresist pattern as a mask to form an LDD region after the formation of the photoresist pattern.

12. The method of claim 8, further comprising annealing the source/drain to again align the source/drain.

13. The method of claim 8, wherein forming the sidewall at both sides of the gate comprises selectively etching the exposed insulating layer to form sidewalls at both sides of the gate.

14. The method of claim 8, wherein the forming the sidewalls at both sides of the gate comprises:
   removing the exposed insulating layer;
   forming a second insulating layer on the semiconductor substrate; and
   selectively etching the second insulating layer to form sidewalls at both sides of the gate.

15. A method comprising:
   forming a photoresist pattern directly on a gate formation region of a gate oxide layer of a semiconductor substrate;
   forming a liquid oxide layer over the gate oxide layer excluding only the gate formation region containing the photoresist pattern;
   removing the photoresist pattern after forming the insulating layer;
   forming a polysilicon layer over the gate formation region of the gate oxide layer after the photoresist pattern has been removed; and
   removing the liquid oxide layer to form a gate.

16. The method of claim 15, further comprising:
   planarizing the polysilicon to expose the liquid oxide layer to form the gate;
   forming sidewalls at both sides of the gate; and
   implanting ions in a resulting object using the sidewalls as a mask to form a source/drain.

* * * * *